(12) United States Patent
Miller et al.

(10) Patent No.: US 12,351,900 B2
(45) Date of Patent: Jul. 8, 2025

(54) PLASMA BASED FILM MODIFICATION FOR SEMICONDUCTOR DEVICES

(71) Applicant: Applied Materials, Inc., Santa Clara, CA (US)

(72) Inventors: Timothy J. Miller, Ipswich, MA (US); Vikram M. Bhosle, North Reading, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/306,111

(22) Filed: Apr. 24, 2023

(65) Prior Publication Data

US 2024/0352575 A1    Oct. 24, 2024

(51) Int. Cl.
| | |
|---|---|
| *C23C 14/34* | (2006.01) |
| *C23C 14/06* | (2006.01) |
| *H01J 37/34* | (2006.01) |
| *H01L 21/265* | (2006.01) |

(52) U.S. Cl.
CPC ...... *C23C 14/3492* (2013.01); *C23C 14/0682* (2013.01); *C23C 14/0694* (2013.01); *C23C 14/345* (2013.01); *H01J 37/347* (2013.01); *H01L 21/26506* (2013.01); *H01J 2237/2001* (2013.01); *H01J 2237/332* (2013.01)

(58) Field of Classification Search
CPC ......... H01L 21/26506; H01J 2237/332; H01J 37/347; H01J 2237/2001; C23C 14/3492; C23C 14/0682; C23C 14/0694; C23C 14/345
See application file for complete search history.

(56) References Cited

U.S. PATENT DOCUMENTS

| | | | |
|---|---|---|---|
| 8,722,494 B1 * | 5/2014 | Basker ............ | H01L 21/823462 257/E21.409 |
| 2011/0165781 A1 * | 7/2011 | Liang .................... | C23C 16/345 257/E21.24 |
| 2013/0288485 A1 * | 10/2013 | Liang ................ | H01L 21/02326 438/782 |

* cited by examiner

*Primary Examiner* — Sue A Purvis
*Assistant Examiner* — Vicki B. Booker
(74) *Attorney, Agent, or Firm* — KDW Firm, PLLC

(57) ABSTRACT

Disclosed herein are approaches for treating a film layer of a semiconductor device to modify an etch resistance of the film later. In one approach, a method may include forming a first film over a substrate base, depositing a second film over the first film, and introducing an inert species into the second film while the second film is deposited over the first film, wherein the inert species increases an etch-resistance of a first portion of the first film. The method may further include removing the second film by stopping deposition of the second film while continuing to introduce the inert species into the second film.

11 Claims, 6 Drawing Sheets

PLASMA BASED FILM MODIFICATION FOR SEMICONDUCTOR DEVICES

FIELD OF THE DISCLOSURE

The present disclosure relates to semiconductor structures and, more particularly, to a plasma-based film modification for semiconductor structures.

BACKGROUND OF THE DISCLOSURE

Dielectric films are used throughout the semiconductor manufacturing process. In many cases these films have less than ideal properties including low etch resistance, low density, and high porosity. This is particularly the case when the dielectrics need to conform to non-planar structures. Example dielectrics include flowable CVD (FCVD) and spin on glass/dielectric (SOG/D), which have additional species such as H, N, C that affect these properties.

For flowable silicon dioxide (SiO2) based films, improving etch resistance sf of particular interest. For example, with poor etch resistance, divots can form in the film, particularly between non-planar structures. One current method to treat the film includes using ion implantation of silicon whereby the implanted silicon can both increase the film density as well as increase the ratio of Si beyond the approximate 1/3 silicon to 2/3 oxygen ratio, thereby improving the etch resistance. However, in this approach, maximum dose is limited by excessive surface sputtering of the film, and productivity is low.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a first film over a substrate base, depositing a second film over the first film, and introducing an inert species into the second film while the second film is deposited over the first film, wherein the inert species increases an etch-resistance of a first portion of the first film. The method may further include removing the second film by stopping deposition of the second film while continuing to introduce the inert species into the second film.

In another aspect, a method for treating a dielectric film of a semiconductor device may include forming the dielectric film over a substrate base, depositing a second film over the dielectric film, and introducing an inert species into the second film while the second film is being deposited over the dielectric film, wherein the inert species increases an etch-resistance of a first portion of the dielectric film. The method may further include removing the second film by stopping deposition of the second film while continuing to introduce the inert species into the second film.

In yet another aspect, a method for modifying an etch resistance of a dielectric film of a semiconductor device may include forming the dielectric film over a substrate base, and depositing a second film directly atop the dielectric film. The method may further include introducing an inert species into the second film while the second film is being deposited over the dielectric film, wherein the inert species increases the etch-resistance of a first portion of the dielectric film, and removing the second film by stopping deposition of the second film while continuing to introduce the inert species into the second film.

BRIEF DESCRIPTION OF THE DRAWINGS

The accompanying drawings illustrate exemplary approaches of the disclosure, including the practical application of the principles thereof, as follows.

Figure 1:
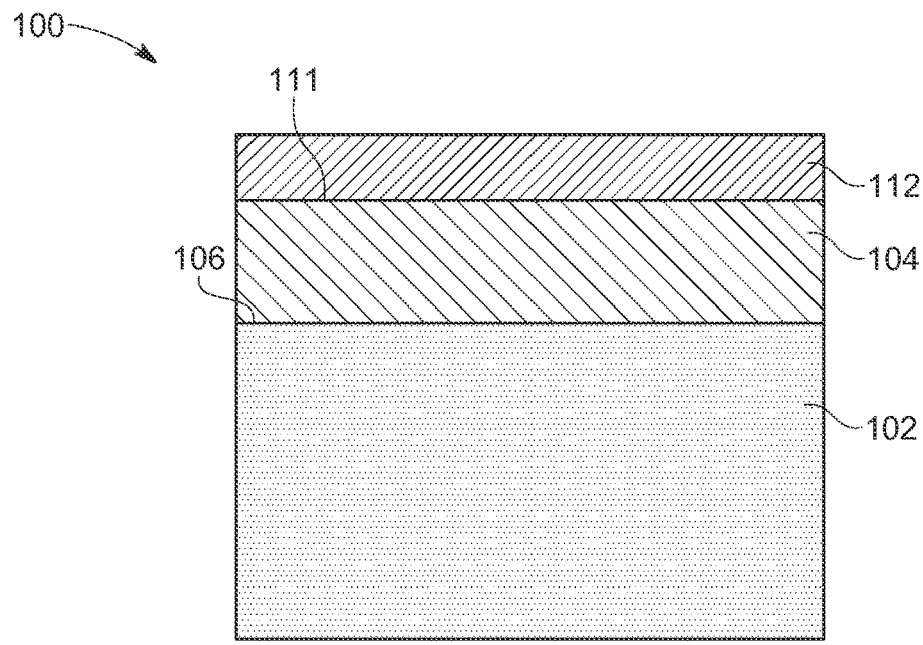
FIG. 1 illustrates a side cross-sectional view of a semiconductor device including a first film layer and a second film layer, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, systems, and methods in accordance with the present disclosure will now be described more fully hereinafter with reference to the accompanying drawings, where various embodiments are shown. The devices, systems, and methods may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the ion implant-based approach of the prior art described above, embodiments herein use a plasma-based approach to knock-in deposited silicon into an underlying film, which decreases an etch rate of the film by increasing silicon fraction and increasing film density. Treating the film with an inert species also prevents divots from being formed in the film, and improves device throughput due to full wafer treatment versus scanning the wafer with an ion beam. Furthermore, increasing the film density reduces an amount of loss to the starting film due to ion sputtering.

FIG. 1 demonstrates an example semiconductor device 100 (hereinafter "device") at one stage of processing. The device 100 may include a substrate base 102 and a first film 104 formed over an upper surface 106 of the substrate base 102. In some embodiments, the substrate base 102 may be silicon, and the first film 104 may be a dielectric film, such as silicon dioxide ($SiO_2$). The first film 104 may be formed using a flowable CVD (FCVD) process. In other embodiments, the first film 104 may be formed using a spin on glass/dielectric (SOG/D) process.

As further shown, a second film 112 may be formed directly atop an upper surface 111 of the first film 104. The second film 112 may be formed using a plasma deposition process in which atoms are directed to the upper surface 111 of the first film 104. In one example, the second film 112 is a silicon film formed using a silane (SiH4) plasma deposition process. In other examples, the second film 112 is formed using a Silicon tetrachloride (SiCl4) or a Silicon Tetrafluoride (SiF4) deposition process. The deposition process to form the second film 112 may continue until a desired thickness above the first film 104 is achieved.

Figure 2:
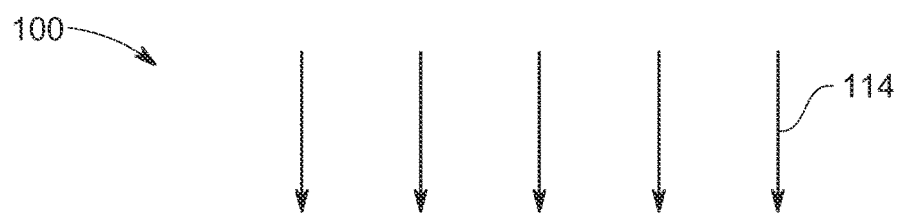
FIG. 2 illustrates a side cross-sectional view of the semiconductor device during introduction of an inert species into the second film while the second film is being deposited over the first film, according to embodiments of the present disclosure.
Figure 2:
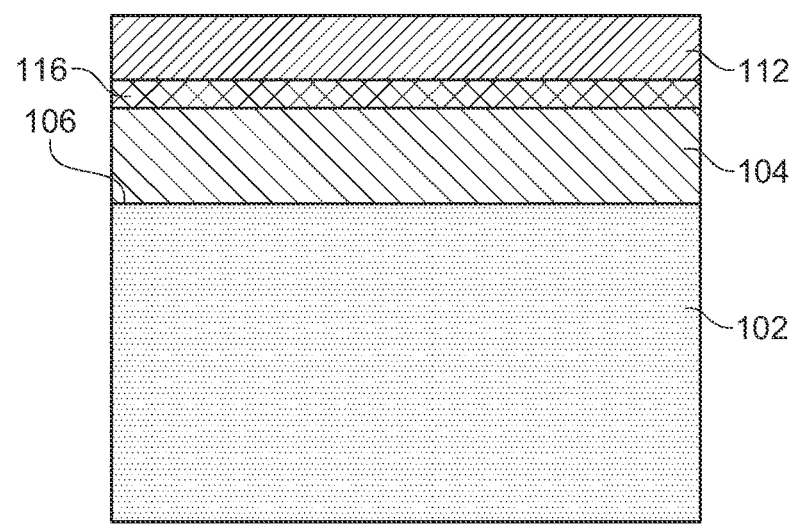
Figure 7:
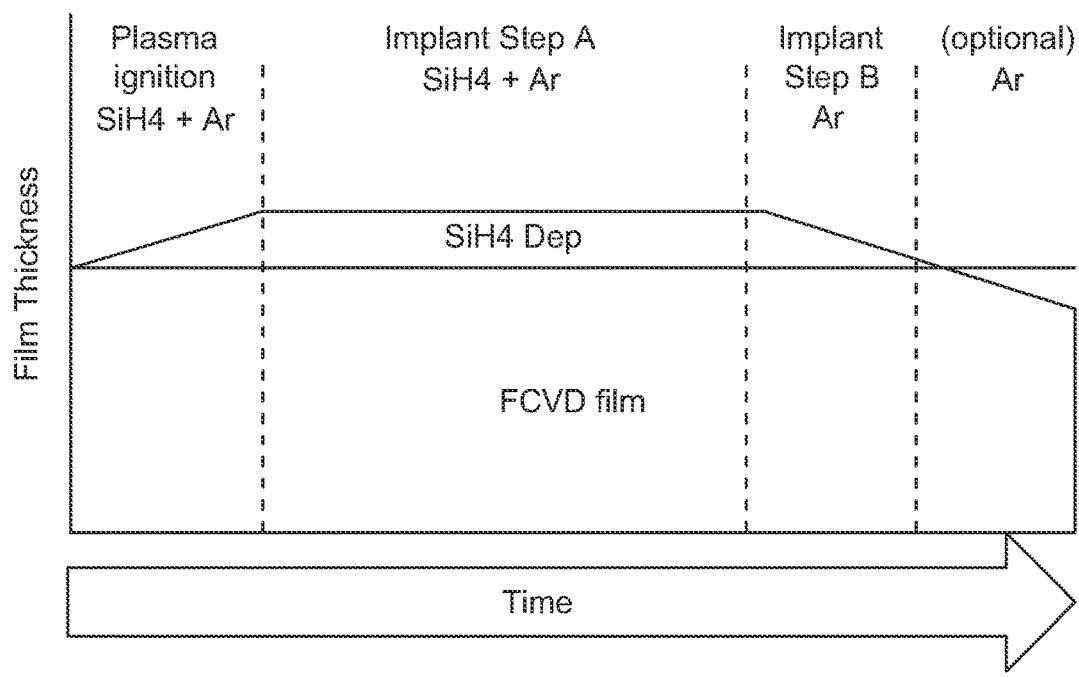
FIG. 7 is a graph illustrating a relationship between film thickness and time, according to embodiments of the present disclosure.
Figure 8:
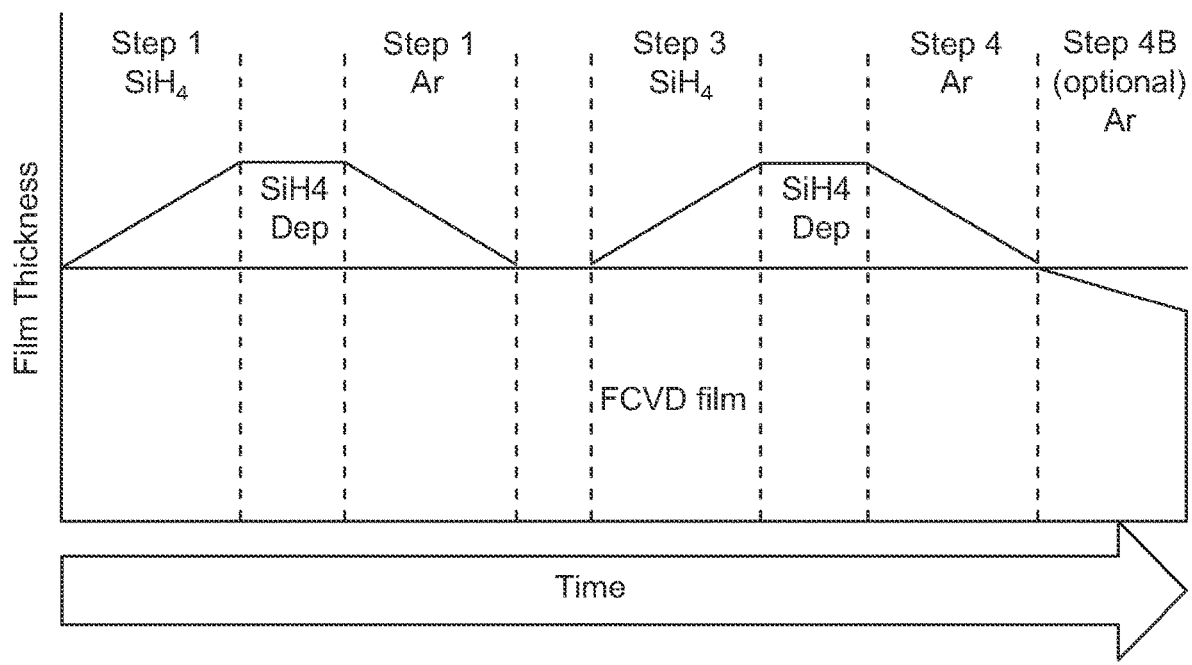
FIG. 8 is a graph illustrating a relationship between film thickness and time, according to embodiments of the present disclosure.

Next, as shown in FIG. 2, an inert species 114 is introduced into the second film 112, wherein the inert species 114 may be Argon (Ar). In other examples, the inert species 114 may be one or more of Helium, Neon, Krypton, or Xenon. The inert species 114 may treat the first film 104 to increase an etch-resistance of a first portion 116 thereof. More specifically, the inert species 114 "knocks-in," or drives in, and sputters atoms (e.g., Si) of the second film 112 into the first film 104. In one example, the inert species 114 is introduced into the second film 112 while the second film 112 is being continuously deposited atop the first film 104. This simultaneous process is shown in FIG. 7, which demonstrates deposition film thickness as a function of time. In another example, the inert species 114 is introduced into the second film 112 after deposition of the second film 112 has stopped, either temporarily or permanently. That is, the process can be run in a cyclical fashion whereby deposition is a first step followed by knock-in and sputter as a second step. The first and second steps may be repeated as desired. This cyclical process is shown in FIG. 8, which demonstrates deposition film thickness as a function of time. It will be appreciated that the species (e.g., SiH4, Ar) listed in FIGS. 7-8 are only examples, and that other species are possible. For example, Silicon tetrachloride (SiCl4) or Silicon Tetrafluoride (SiF4) may be used in place of SiH4, and Helium, Neon, Krypton, or Xenon may be used in place of Ar. Still other species may be used in alternative embodiments.

In some embodiments, the second film 112 is deposited, and the inert species 114 introduced, while the substrate base 102 is at elevated temperature (e.g., RT-600C) to outgas unwanted species in the first film 104. Although not shown, the substrate base 102 may be positioned atop a platform or base, which is heated to the desired temperature. Furthermore, in some embodiments, a bias to the substrate base 102 may be applied after deposition of the second film 112.

The deposition rate of the second film 112 may be maintained such that an amount of atoms added to the surface is approximately matched to the material sputter and knock-in during application of the inert species 114. Said differently, an amount of atoms added is approximately equal to atoms knocked in plus atoms sputtered. A thickness of the second film 112 may remain relatively constant, as a result.

The deposition, treatment, and bias/sputtering steps may continue until a desired amount of silicon is knocked into the first film 104. In one non-limiting example, as a result of the inert species 114 application, an Si to O ratio is increased from 0.33 of SiO2 (i.e., first film 104) to between 0.35 and 0.7. An optimum thickness of the second film 112 may be reached according to a maximum knock-in efficiency (i.e., a maximum number and depth of knocked in atoms). That is, if the second film 112 is too thick, atoms are blocked. If the second film 112 is too thin, insufficient atoms are knocked-in. In one example, the second film 112 is initially between 5 A and 50 A and the implant voltage is between 0.5 KV and 10 KV in order to maximize knock-in efficiency.

In one non-limiting example, a SiH4 deposition and knock-in/sputter with diluted Ar is performed. The SiH4 flow may be low (e.g., <10 standard cubic centimeters per minute (sccm)) to allow deposition of approximately 5-10 Angstroms in a few seconds to control deposition thickness. During implant, the SiH4 should be low enough to match the maximum sputter rate of Ar. The Ar may be added as a diluent to maintain pressure control and gas distribution through one or more gas nozzles (not shown). Having SiH4 with Ar dilution allows for transition to implant step without changing conditions.

Although non-limiting, a bias energy may be chosen to maximize knock-in depth without penetrating the substrate base 102. Bias duty cycle and/or SiH4 flow may also be chosen to match deposition rate with (knock-in +sputter) rate. It will be appreciated that bias energy and/or bias duty cycle may vary, as desired.

Figure 3:
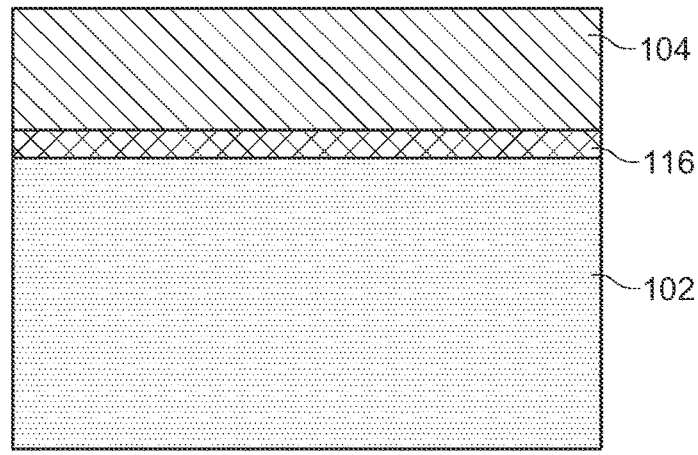
FIG. 3 illustrates a side cross-sectional view of the semiconductor device following removal of the second film layer, according to embodiments of the present disclosure.

Next, as shown in FIG. 3, the second film 112 may be removed from over the first film 104. Removing the second film 112 may be accomplished by first stopping deposition of the second film 112 but continuing to introduce the inert species 114 into the second film 112. That is, the knock-in, sputtering, and biasing steps may continue to progressively remove the second film 112. In other embodiments, to remove the second film 112, deposition of the second film 112 may continue, but the sputter rate during application of the inert species 114 is set to exceed the deposition rate of the second film 112 until the second film 112 is removed. It will be appreciated that the sputter rate can be actively modified during processing to influence a thickness of the second film 112.

Figure 4:
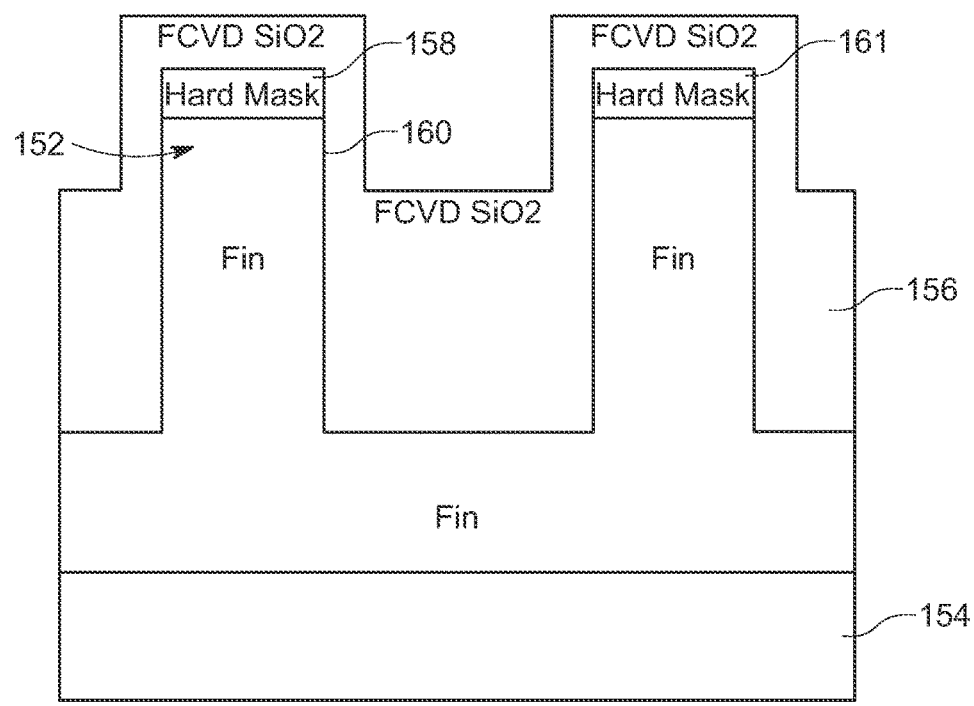
FIG. 4 illustrates a side cross-sectional view of a semiconductor device including a first film layer formed over a plurality of fins of a semiconductor device, according to embodiments of the present disclosure.

Turning to FIG. 4, another plasma-based film treatment application is demonstrated. In this embodiment, a device 150 may include a plurality of 3-dimensional features, such as fins 152 of a FinFET, wherein the fins 152 extend vertically from a base 154. A dielectric film 156 may be deposited over the device 150 such that it contours to an upper surface 158 and a sidewall surface 160 of each of the fins 152. In some embodiments, a hardmask 161 may be formed atop each fin 152. The dielectric film 156 may be further formed within a trench between adjacent fins 152. In some embodiments, the dielectric film 156 may be SiO2 formed using a FCVD process.

Figure 5:
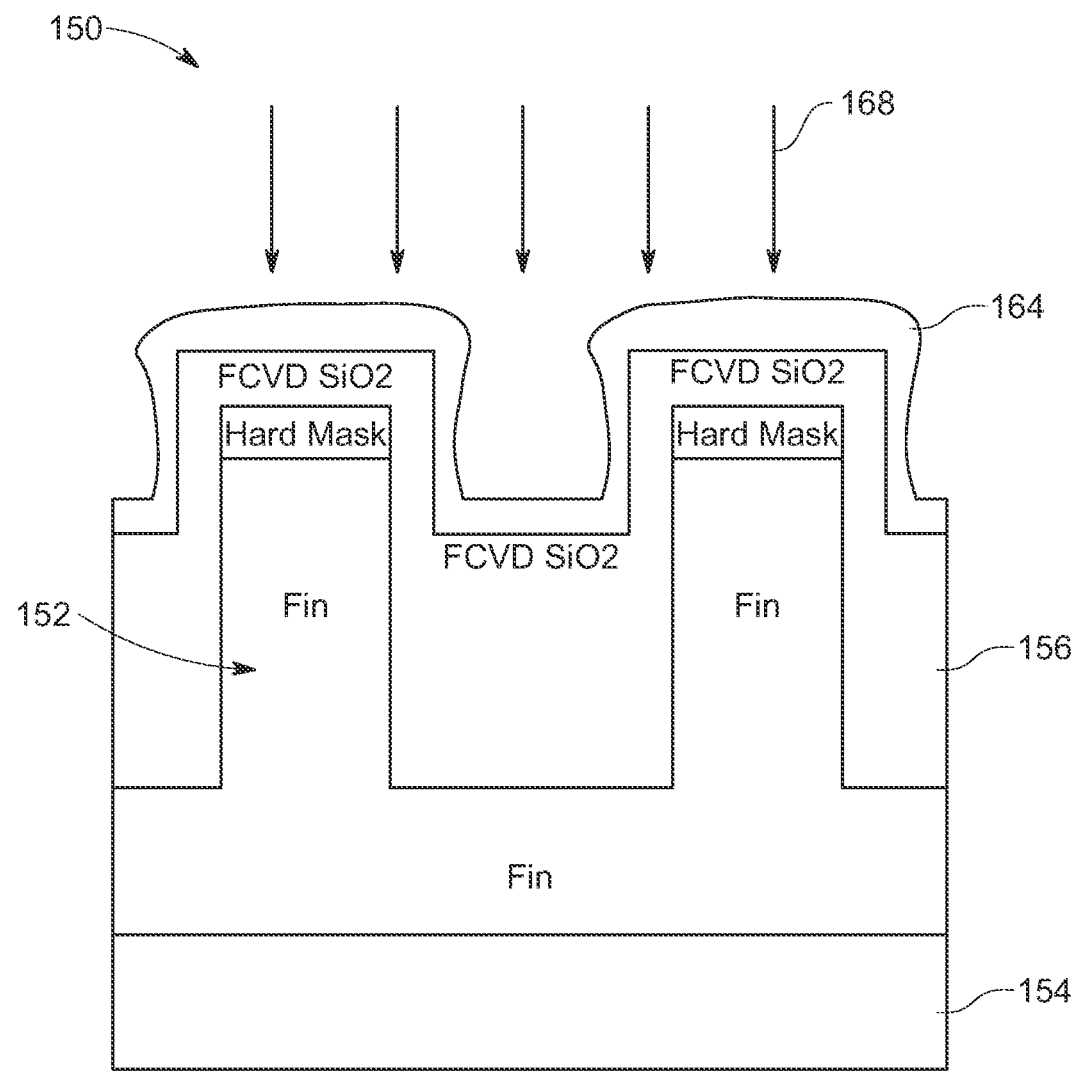
FIG. 5 illustrates a side cross-sectional view of the semiconductor device following formation of a second film layer over the first film layer, according to embodiments of the present disclosure.

As shown in FIG. 5, a second film 164 may be formed directly atop an upper surface of the dielectric film 156. The second film 164 may be formed using a plasma deposition process in which atoms are directed to the upper surface of the dielectric film 156. In one example, the second film 164 is a silicon film formed using a SiH4 plasma deposition process. The deposition process to form the second film 164 may continue until a desired thickness above the dielectric film 156 is achieved.

As further shown, an inert species 168 may be introduced into the second film 164, wherein the inert species 168 may be Argon (Ar). In other examples, the inert species 168 may be one or more of Helium, Neon, Krypton, or Xenon. The inert species 168 may treat the dielectric film 156 to increase an etch-resistance thereof. As described above, the inert species 168 "knocks-in," or drives in, and sputters atoms (e.g., Si) of the second film 164 into the dielectric film 156 while the second film 164 is being deposited. The deposition, treatment, and bias/sputtering steps may continue until a desired amount of silicon is knocked into the dielectric film 156.

Figure 6:
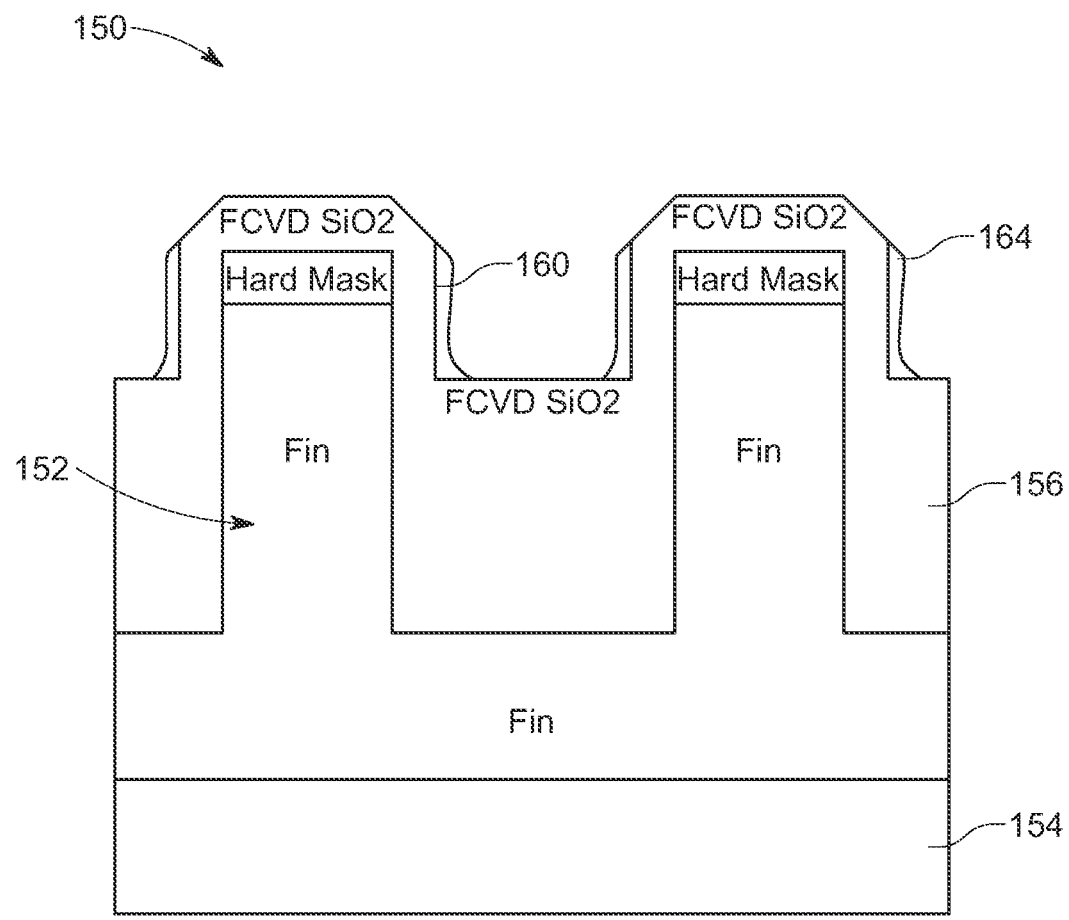
FIG. 6 illustrates a side cross-sectional view of the device following removal of the second film layer, according to embodiments of the present disclosure.

As shown in FIG. 6, the second film 164 may then be removed from over the dielectric film 156 by first stopping deposition of the second film 164, but continuing to introduce the inert species 168 into the second film 164. That is, the knock-in, sputtering, and biasing steps may continue, to progressively remove the second film 164. As shown, in the case that the second film 164 remains partially along the sidewall surface 160 of the fins 152, an H2 plasma or other Si etching plasma can be delivered to the fins 152 to remove the second film 164 therefrom.

Figure 9:
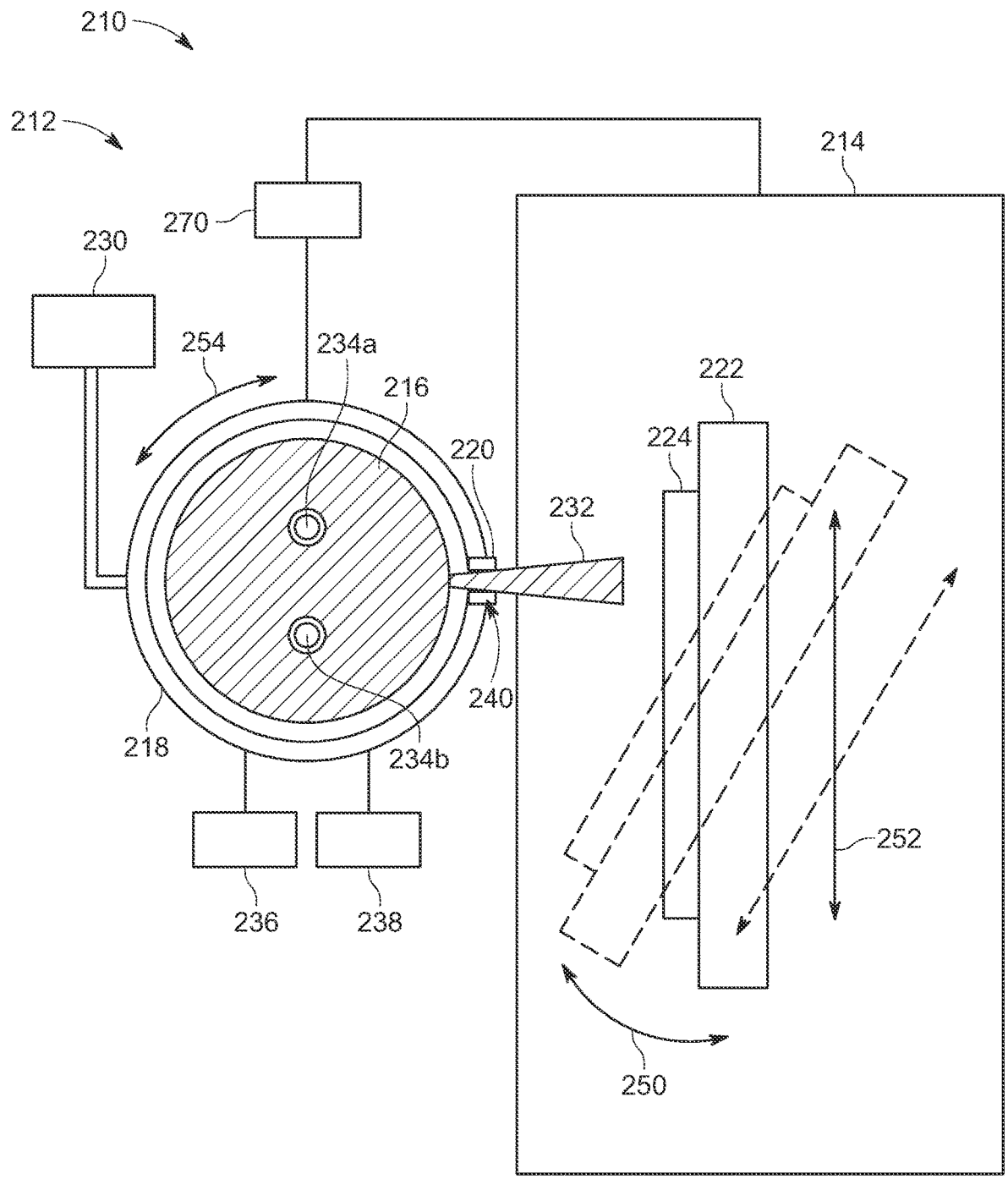
FIG. 9 is a schematic diagram of a system for forming the semiconductor device, in accordance with embodiments of the present disclosure.

FIG. 9 illustrates a portion of a system 210 useful to perform processes described herein, such as deposition of the material to form second films 112, 164. The system 210 may generally include a plasma source 212 disposed adjacent a process chamber 214. The plasma source 212 may be adapted to generate an energetic plasma 216 in a plasma chamber 218, and to emit the plasma 216, e.g., through a nozzle 220 of the plasma chamber 218. In other embodiments, the plasma 216 may be delivered through a second plate (not shown) with a separate aperture situated a specific distance away from the plasma chamber 218. While the plasma chamber 218 is depicted as being generally cylindrical in shape, the present disclosure is not limited in this regard, and the plasma chamber 218 may be implemented in a variety of alterative shapes and configurations.

The process chamber 214 may contain a wafer support or platen 222 adapted to support a substrate 224 (e.g., a silicon wafer) in a confronting relationship with the nozzle 220 of the plasma chamber 218. In various embodiments, the platen 222 may be adapted to forcibly retain the substrate 224, such as via electrostatic clamping or mechanical clamping. Additionally, the platen 222 may include a heating element (not shown) for controllably heating the substrate 224 to a desired temperature (e.g., a temperature in a range between room temperature and 600 degrees Celsius) to enhance deposition processes.

The plasma source 212 of the system 210 may be configured to generate the plasma 216 from a gaseous species supplied to the plasma chamber 218 by one or more gas sources 230. The gaseous species may include one or more of SiH4, CH4, NH3, O2, N2, SiCl4, GeH4, Ar, WF6, B2H6, etc. The present disclosure is not limited in this regard, however. The plasma 216 may be projected through the nozzle 220 in the form of a ribbon beam 232 directed at the substrate 224 as further described below. In various embodiments, the plasma source 212 may be a radio frequency (RF) plasma source (e.g., an inductively coupled plasma (ICP) source, a capacitively coupled plasma (CCP) source, a helicon source, an electron cyclotron resonance (ECR) source, etc.). For example, the plasma source 212 may include electrodes 234a, 234b, an RF generator 236, and an RF matching network 238 for igniting and sustaining the plasma 216 in a manner familiar to those of ordinary skill in the art. The present disclosure is not limited in this regard.

The plasma 216 generated in the plasma chamber 218 may contain ionized gas species (ions), electrons, excited neutrals, and free radicals. In conventional plasma enhanced chemical vapor deposition (PECVD) systems, a substrate is located in the same chamber as a plasma, and free radicals within the plasma are distributed over the surface of the substrate in a directionally-nonspecific, isotropic manner to form a thin film of generally uniform thickness on the exposed surface(s) of the substrate. By contrast, the plasma chamber 218 of the system 210 is separate from the process chamber 214 where the platen 222 and the substrate 224 reside, and a collimated ribbon beam 232 containing free radicals of the plasma 216 is extracted from the plasma chamber 218 and is directed at the substrate 224 in a directionally specific, anisotropic manner. This is achieved by establishing a pressure differential between the plasma chamber 218 and the process chamber 214, and by collimating the radical beam.

In a non-limiting example, the radical beam may be extracted through a nozzle 220 or a second aperture plate having an elongated profile. With regard to the pressure differential, the process chamber 214 may be maintained at a first pressure, and the plasma chamber 218 may be maintained at a second pressure higher than the first pressure. In various examples, the first pressure in the process chamber may be in a range of $10^{-6}$ torr to $10^{-2}$ torr, and the second pressure in the plasma chamber 218 may be in a range of 1 millitorr to 1 torr. The present disclosure is not limited in this regard. Thus, the pressure differential between the plasma chamber 218 and the process chamber 214 may provide a motive force for driving free radicals in the plasma 216 from the plasma chamber 218 into the process chamber 214 in the form of ribbon beam 232.

The ribbon beam 232 may be given its shape and may be collimated using various structures, devices, and techniques. In one example, the ribbon beam 232 may be given its shape and may be collimated by the elongated, low-profile nozzle 220 of the plasma chamber 218 or alternatively with a second plate set a specific distance away from 218 with a second aperture slot.

The platen 222 may be rotatable and movable for pivoting and scanning the substrate 224 relative to the plasma chamber 218 as indicated by arrows 250 and 252. Additionally, or alternatively, the plasma chamber 218 may be rotatable about its long axis as indicated by the arrow 254. Thus, the collimated, free radical-containing ribbon beam 232 may be projected onto the substrate 224 at various oblique angles in a highly directional, anisotropic manner to deposit films on specific portions of the substrate 224. In a non-limiting example, the movement and/or rotation of the platen 222 and/or the plasma chamber 218 may facilitate projecting the ribbon beam 232 onto the substrate 224 at wide range of angles and/or angle spreads.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method for treating a dielectric film of a semiconductor device, the method comprising:
   forming the dielectric film over a substrate base;
   depositing a second film over the dielectric film to a desired thickness, wherein the dielectric film and the second film are different materials;
   after the second film is formed to the desired thickness, begin introducing an inert species into the second film while the second film continues being deposited over the dielectric film, wherein the inert species is further introduced into the dielectric film, through the second film, to increase an etch-resistance of an upper portion of the dielectric film at an interface between the dielectric film and the second film; and
   removing the second film by stopping deposition of the second film while continuing to introduce the inert species into the second film.

2. The method of claim 1, further comprising applying a bias to the substrate base prior to depositing the second film over the dielectric film.

3. The method of claim 1, further comprising maintaining a constant thickness of the second film as the inert species is being introduced into the second film by optimizing deposition of the second film and sputtering of the second film as the inert species is being introduced into the second film.

4. The method of claim 1, wherein the second film comprises at least one of the following: silane (SiH4), Silicon tetrachloride (SiCl4), and Silicon Tetrafluoride (SiF4), and wherein the inert species comprises at least one of the following: Argon, Helium, Neon, Krypton, or Xenon.

5. The method of claim 1, wherein forming the dielectric film over the substrate base comprises forming the dielectric film over a plurality of fins extending from the substrate base.

6. The method of claim 1, further comprising maintaining the substrate base at a temperature greater than 20° C.

7. The method of claim 1, further comprising driving in and sputtering atoms of the second film into the dielectric film to increase the etch-resistance of the first portion of the dielectric film.

8. A method for modifying an etch resistance of a dielectric film of a semiconductor device, the method comprising:
   forming the dielectric film over a substrate base;
   depositing a second film directly atop the dielectric film to a desired thickness, wherein the dielectric film and the second film are different materials;
   after the second film is formed to the desired thickness, begin introducing an inert species into the second film while the second film continues being deposited over the dielectric film, wherein the inert species is further introduced into the dielectric film, through the second film, to increase an etch-resistance of an upper portion of the dielectric film at an interface between the dielectric film and the second film; and
   removing the second film by stopping deposition of the second film while continuing to introduce the inert species into the second film.

9. The method of claim 8, further comprising applying a bias to the substrate base after depositing the second film over the first film, wherein the bias to the substrate is maintained until the second film is removed.

10. The method of claim 8, wherein the second film comprises at least one of the following: silane (SiH4), Silicon tetrachloride (SiCl4), and Silicon Tetrafluoride (SiF4), and wherein the inert species comprises at least one of the following: Argon, Helium, Neon, Krypton, or Xenon.

11. The method of claim 8, wherein forming the dielectric film over the substrate base comprises forming the dielectric film over a sidewall and over an upper surface of each fin of a plurality of fins extending from the substrate base.

* * * * *